United States Patent [19]
Xiao

[11] Patent Number: 6,137,432
[45] Date of Patent: Oct. 24, 2000

[54] LOW-POWER COLUMN PARALLEL ADC IN CMOS IMAGE SENSORS

[75] Inventor: Peter Hong Xiao, San Jose, Calif.

[73] Assignee: I C Media Corporation, San Jose, Calif.

[21] Appl. No.: 09/187,308

[22] Filed: Nov. 4, 1998

[51] Int. Cl.[7] .................................................. H03M 1/56
[52] U.S. Cl. ......................... 341/169; 341/170; 341/155
[58] Field of Search ................................... 341/169, 170, 341/155

[56] References Cited

U.S. PATENT DOCUMENTS

| | | | |
|---|---|---|---|
| 4,851,839 | 7/1989 | Reinke | 341/128 |
| 5,321,404 | 6/1994 | Mallinson et al. | 341/169 |
| 5,461,425 | 10/1995 | Fowler et al. | 348/294 |
| 5,613,156 | 3/1997 | Katayama | 395/827 |

OTHER PUBLICATIONS

B. Pain and E.R. Fossum, Approaches and Analysis For On–Focal–Plane Analog–to–Digital Conversion, SPIE, 1994, pp. 208–218, vol. 2226, Infrared Readout Electronics II.

Primary Examiner—Brian Young
Assistant Examiner—Jason L. W. Kost
Attorney, Agent, or Firm—Fernandez & Associates, LLP

[57] ABSTRACT

A low-power column parallel ADC architecture for image sensors that reduces the power consumption by reducing the number of switchings of a comparator to digitize a row of pixel data. Two ramp reference signals are provided in accordance with the principles of this invention. A first ramp signal is provided to each comparator that is clocked with an associated first clock signal. In each column comparator, the first ramp signal is compared to the pixel data using clock1, wherein clock1 corresponds to N multiple of a second clock signal (clock2), with N>1. Only when the column comparator detects a first crossover with the first ramp signal, then the comparator switches at every clock cycle of the second clock, clock2, to compare and detect a second crossover point with the second reference signal. This arrangement can greatly reduce the number of switchings required to digitize a row of pixel data, thereby resulting in significant power saving.

7 Claims, 2 Drawing Sheets

LOW-POWER COLUMN PARALLEL ADC IN CMOS IMAGE SENSORS

FIELD OF INVENTION

The invention relates generally to analog-to-digital converters (ADCs), and more particularly to ADCs in CMOS image sensors.

BACKGROUND OF INVENTION

Conventional CMOS imager sensors read out a row of pixel values at a time to increase the read-out bandwidth, with a row of pixel values digitized in parallel by means of an ADC provided for each pixel column. Such conventional imaging sensor ADCs are illustrated in U.S. Pat. No. 4,851,839 to Reinke, U.S. Pat. No. 5,613,156 to Katayama, and U.S. Pat. No. 5,461,425 to Fowler, et al. Typically, these ADCs comprise a comparator with one of the comparator inputs connected to the bit line of the pixel and the other input connected to a reference signal that is a ramp signal. At every clock cycle, the bit line of the pixel is compared to the reference signal. Initially, the reference signal is less than the pixel signal (e.g., the bit line value), and thus the comparator generates a "0" output value. When the ramp reference crosses the pixel signal, then the comparator generates a '1', indicating a valid value of the pixel data. This crossover indicates that a valid value of the pixel signal is latched by a register which is typically coupled to the output of the comparator.

Conventional ADCs, however, suffers a shortcoming of causing large power dissipation. A row of ADC comparators is continuously switching at every clock cycle resulting in significant power consumption, particularly when the number of comparators needed increases with the size of the image sensors, with some large format sensors now requiring greater than a thousand comparators. Moreover, the continuous switchings of the comparators result in much wasted power since only switchings around the crossover point are particularly relevant. Thus, there is a need for a lower power ADC architecture for CMOS image sensors.

SUMMARY OF INVENTION

Invention resides in a new low-power column parallel ADC architecture for image sensors which reduces the power consumption by reducing the number of switchings of a comparator to digitize a row of pixel data. Two ramp reference signals are provided in accordance with the principles of this invention. A first ramp signal is provided to each comparator that is clocked with an associated first clock signal. Each column comparator compares the first ramp signal to the pixel data using the first clock, wherein the first clock (clock1) corresponds to N multiple of a second clock signal (clock2), with N>1. Only when the column comparator detects a first crossover with the first ramp signal, then clock2 is provided to clock each comparator and to detect a second crossover point with the second reference signal. This arrangement can greatly reduce the number of switchings required to digitize a row of pixel data, thereby also providing significant power saving.

DETAILED DESCRIPTION OF PREFERRED EMBODIMENT(S)

Figure 1:
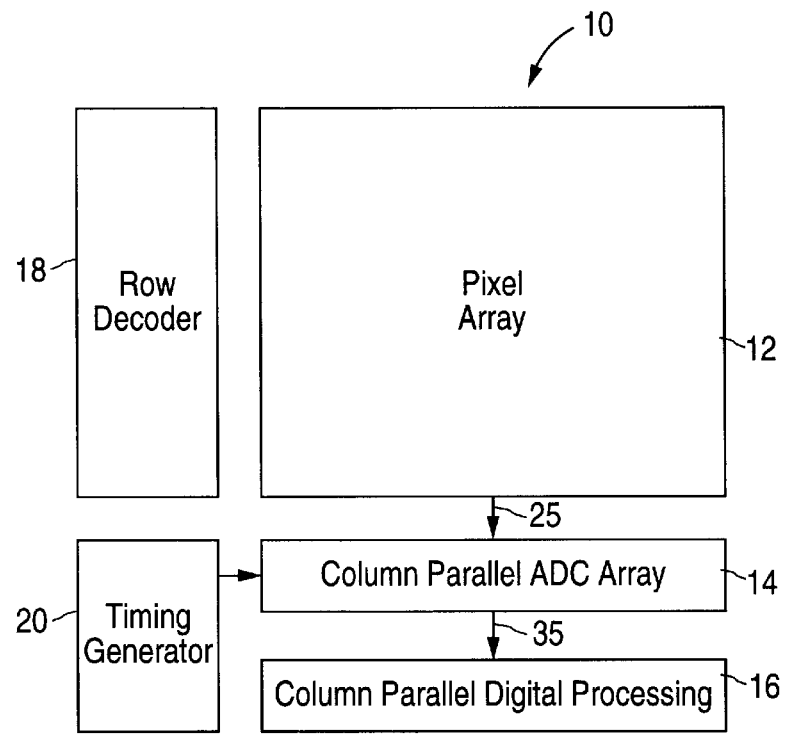
FIG. 1 is a general system-level block diagram of an image sensor architecture designed in accordance with the principles of this invention.

FIG. 1 is a general system-level block diagram of a low-power column parallel ADC image sensor architecture designed in accordance with the principles of this invention. Low-power column parallel ADC image sensors architecture 10 reduces power consumption by reducing the number of switching operations of an array of comparators 14 necessary to digitize a row of pixel data from pixel array 12.

Figure 2:
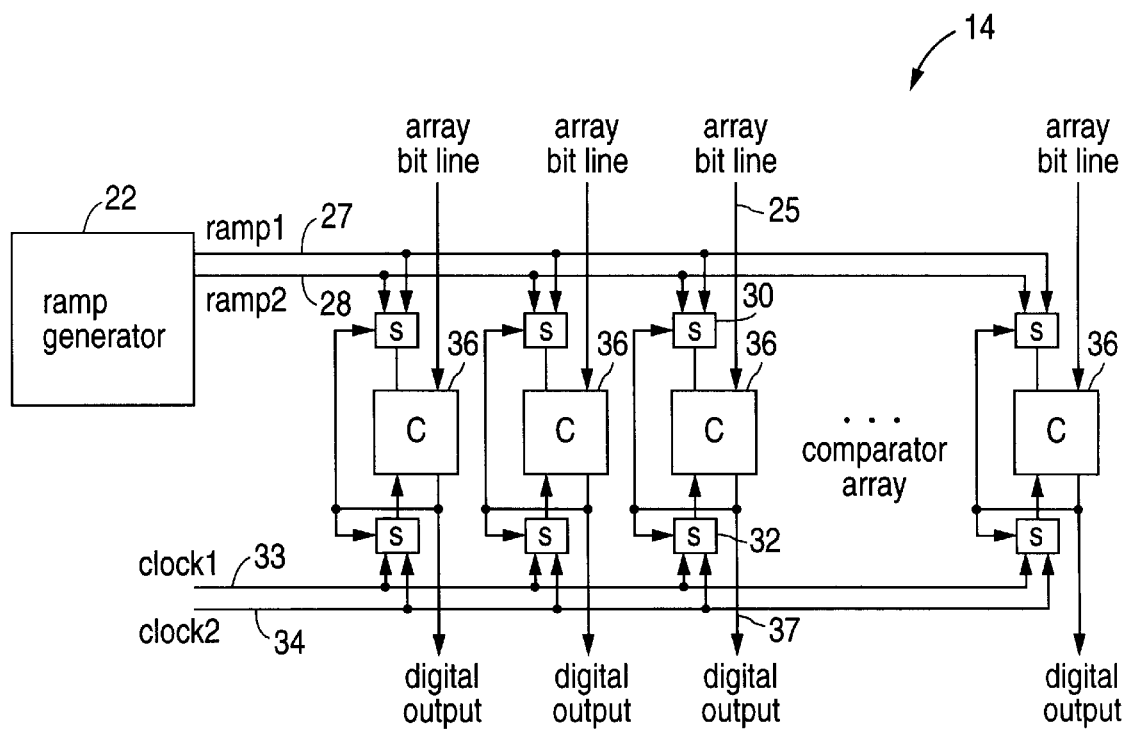
FIG. 2 is a more detailed logic block diagram of the low-power column parallel ADC array of FIG. 1 provided in accordance with the principles of this invention.

FIG. 2 provides a more detailed logic block diagram of the low-power column parallel ADC array of FIG. 1. Two ramp reference signals 27 and 28 provided by a ramp generator 22 in timing generator 20 (FIG. 1) are provided as input to column parallel ADC array 14. A first ramp signal (ramp1) 27 and a second ramp signal (ramp2) 28 are provided to each comparator 36 of array 14 via a first multiplexer 30. In each column comparator 36, first ramp signal 27 is compared to an input array bit line signal 25 using a first clock signal (clock1) 33 from timing generator 20 provided as input clock to each comparator 36 via MUX 32. With clock1, each comparator 36 switches every N clock cycles, where N corresponds to a multiple of a second clock signal (clock2) 34, with N>1.

Figure 3:
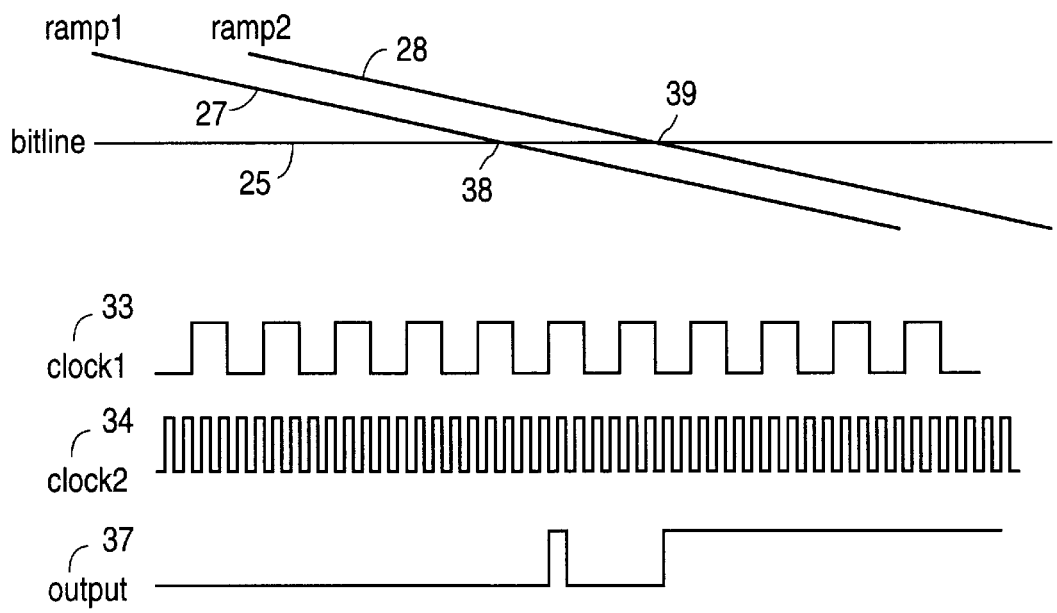
FIG. 3 shows a sample timing illustration of the signals provided with the low-power column parallel ADC array of FIG. 2.

As shown in the timing illustration of FIG. 3, when column comparator 36 detects a first crossover point 38 of bit line 25 with ramp1 27, then MUX 30 selects ramp2 28 as input reference signal to provide each comparator 36, and MUX 32 also selects the second clock signal (clock2) 34 as input clock to array of comparators 14. Each comparator 36 then switches with the increased clock cycle of clock2 to detect a second crossover point 39 with the second reference signal 28 (ramp2). This arrangement thus greatly reduce the number of switchings required of array of comparators 14 to digitize a row of pixel data, thereby resulting in significant power saving.

Figure 4:
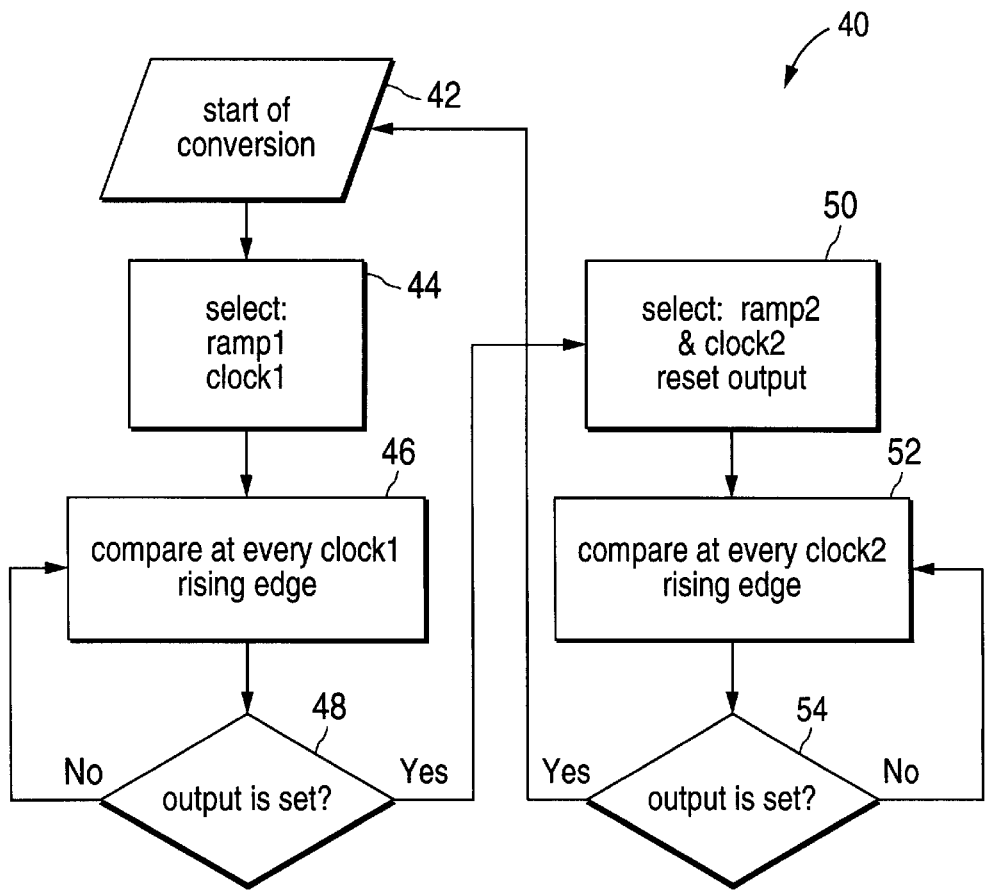
FIG. 4 is a flow chart of operational steps for implementing present invention.

A novel method of providing a low-power column parallel ADC architecture for image sensors 40 is illustrated in FIG. 4. FIG. 4 illustrates a flow chart of operational steps for implementing present invention as also previously discussed above with reference to FIGS. 1–3. Method of providing low-power column parallel ADC 40 comprises a first step 42 of triggering a start of pixel digitization, such as with a row start signal or other such initial triggering signal. Second step 44 comprises selecting ramp1 27 and clock1 33 as input reference and timing signals to each comparator 36 of FIG. 2. Step 46 comprises each comparator 36 comparing an array bit line signal 25 to ramp1 at each rising edge of clock1. Step 48 comprises detecting whether output 37 of comparator 36 is set. If output 37 is not set, then repeat step 46 of comparing array bit line 25 at every clock1 with first ramp signal, ramp1. If, however, a set value is detected as output 37, step 50 comprises selecting ramp2 signal and clock2 as input reference and timing signals, respectively, to array of ADC 14, and resetting output 37 of comparator 36. Step 52 comprises comparator 36 switching at every rising edge of clock2 to compare input bit line 25 to second reference signal, ramp2. Step 54 then comprises checking whether output 37 is set as a result of each clocked comparison. If a set signal is detected, then output 37 can be latched for later data processing, and the operation is returned to step 42 to start digitizing a new row of pixel data.

Although the above apparatus and method has been described with comparator 36 switching in response to a rising clock edge of clock1 and clock2, it is obvious and contemplated as within the scope of this invention that, alternatively, the falling edge of these corresponding signals can be used. Moreover, it is contemplated that the low power column parallel ADC architecture of this invention is not limited to CMOS technology, but can be applicable with other semiconductor technology.

The foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks.

Moreover, other variations and embodiments are possible in light of above teachings, and it is thus intended that the scope of invention not be limited by this Detailed Description, but rather by claims following.

What is claimed is:

1. A low-power column parallel ADC for image sensors comprising:

a column parallel ADC array, the ADC array comprising a plurality of comparators, each comparator comprising a first data input coupled to an array bit line;

a first ramp reference signal and a second ramp reference signal selectively coupled to a reference input of each comparator; and a first clock signal associated with a first ramp signal and a second clock signal associated with a second ramp signal, the first clock and second clock signal also selectively coupled to a clock input of each comparator, wherein, if the first ramp signal is selected as input to each comparator, the corresponding first clock signal is also selected as input to clock each comparator.

2. The low-power parallel ADC of claim 1 wherein the first clock signal is a N multiple of the second clock signal, where N>1.

3. The low-power parallel ADC of claim 1 wherein each comparator further comprises:

an associated first multiplexer, the first multiplexer coupled to receive as input the first and second reference signals with a first multiplexer output coupled to the reference signal input of the comparator to provide either the first or second reference signal to the comparator; and an associated second multiplexer, the second multiplexer coupled to receive as input the first and second clock signals with a second multiplexer output coupled to the clock signal input of the comparator to provide either the first or second clock signal to the comparator.

4. A method of providing a low-power column parallel ADC architecture for image sensors comprising:

starting pixel digitization;

selecting a first ramp signal (ramp1) and an associated first clock signal (clock1) and providing ramp1 and clock1 to each comparator in an array of comparators;

comparing an array bit line signal to ramp1 at each clock1 signal;

detecting whether an output of each comparator is set to identify a first crossover point with ramp1, wherein if the output of that comparator is not set, then repeating the step of comparing array bit line at every clock1 with ramp1; and wherein, if however, a set value is detected as the comparator output then selecting a second ramp signal (ramp2) and a second clock signal (clock2) as input reference and timing signals to each comparator.

5. The method of providing a low-power column parallel ADC architecture of claim 4 further comprising:

detecting whether the output of each comparator is set to identify a second crossover point with ramp2; and wherein if the output of each comparator is set then returning operation again to starting pixel digitization step to start digitizing a new row of pixel data.

6. The method of providing a low-power column parallel ADC architecture of claim 4 wherein the step of comparing the array bit line signal to ramp1 comprises each comparator switching at a rising edge of clock1.

7. The method of providing a low-power column parallel ADC architecture of claim 4 wherein the step of comparing the array bit line signal to ramp2 comprises each comparator switching at a rising edge of clock2.

* * * * *